United States Patent [19]

Garwin et al.

[11] Patent Number: 4,719,436

[45] Date of Patent: Jan. 12, 1988

[54] STABILIZED CHROMIUM OXIDE FILM

[75] Inventors: Edward L. Garwin, Los Altos; Ali R. Nyaiesh, Palo Alto, both of Calif.

[73] Assignee: The United States of America as represented by the United States Department of Energy, Washington, D.C.

[21] Appl. No.: 893,056

[22] Filed: Aug. 4, 1986

[51] Int. Cl.⁴ ........................ H01P 1/08; C23C 14/00; C23C 16/00

[52] U.S. Cl. ............................... 333/252; 204/192.15; 204/192.22; 333/99 MP; 427/250; 427/252; 427/253; 427/343

[58] Field of Search .................. 333/230, 252, 99 MP; 204/192.15, 192.22, 192.25, 192.31, 37.1; 427/250, 252, 253, 343

[56] References Cited

U.S. PATENT DOCUMENTS

| | | | |
|---|---|---|---|
| 2,971,172 | 2/1961 | Hamilton et al. | 333/252 |
| 3,330,707 | 7/1967 | Reed | 333/99 MP |
| 3,891,884 | 6/1975 | Tisdale . | |
| 4,139,443 | 2/1979 | Sakurai | 204/192.15 X |

OTHER PUBLICATIONS

Bhushan, *Development of R. F. Sputtered Chromium Oxide Coating for Wear Applicaton,* Thin Solid Films (64)(1979), pp. 231-241.

*Primary Examiner*—Paul Gensler

*Attorney, Agent, or Firm*—Clifton E. Clouse, Jr.; Roger S. Gaither; Judson R. Hightower

[57] ABSTRACT

Stabilized air-oxidized chromium films deposited on high-power klystron ceramic windows and sleeves having a thickness between 20 and 150Å are useful in lowering secondary electron emission yield and in avoiding multipactoring and window failure due to overheating. The ceramic substrate for the film is chosen from alumina, sapphire or beryllium oxide.

13 Claims, 14 Drawing Figures

STABILIZED CHROMIUM OXIDE FILM

BACKGROUND OF THE INVENTION

The invention described herein arose in the course of, or under, Contract No. DE-AC03-76SF00515 between the United States Department of Energy and Stanford University.

The invention relates to high power klystron windows, particularly to coatings for ceramic high power klystron windows, and more particularly to thin, stabilized chromium oxide films deposited on ceramic RF windows for alleviating secondary electron emissions, multi-pactoring, ohmic losses and window failure due to overheating.

High-power klystron tube manufacture is subject to a wide variety of difficulties related to incoming material control, polishing and cleaning of components, contamination during assembly and testing and, in addition, processing and operational failures. This invention is directed particularly to operational failures in the tube's alumina ceramic output window.

There are two common problems in use of alumina ceramic output windows. The first is breakage due to overheating and breakdown caused by electron multipactor (resonant multiplication of electrons generated at the high secondary electron yield alumina surface). The second common reason for window breakage is overheating due to excessive rf losses in the coating applied to the ceramic to control multipactor. For lower power level klystrons ($<$35 MW peak power) and short (2.5μsec) pulses these two problems have been adequately controlled by coating the alumina with a thin (15-50 Angstrom) high resistivity (100 MΩ/square) low total secondary electron yield ($\sigma<1.5$) TiN layer. However, higher power klystron tubes ($\geqq$50 MW) with longer pulse lengths (5 μsec) require extremely close control over the deposition conditions and areal density of such a layer, as well as special handling and baking provisions.

Prior investigators have found a conflict between the requirements of providing a ceramic window coating with low electrical resistivity while simultaneously providing a film of sufficient thickness to absorb the primary electrons and substantially suppress the escape of secondary electrons generated at the ceramic window surface. This conflict becomes more acute as the power level within the klystron increases.

SUMMARY OF THE INVENTION

The present invention provides an air oxidized chromium film as a thin anti-multipactor coating for klystron windows.

It is therefore an object of this invention to provide an oxidized chromium film which exhibits the required resistivity for low rf-loss.

A further object of this invention is to provide an oxidized chromium film which exhibits stability in secondary electron emission yield under bakeout and electron bombardment.

Other objects of the invention will become readily apparent to those skilled in the art from the following description and accompanying drawings.

DETAILED DESCRIPTION OF THE INVENTION

Figure 1:
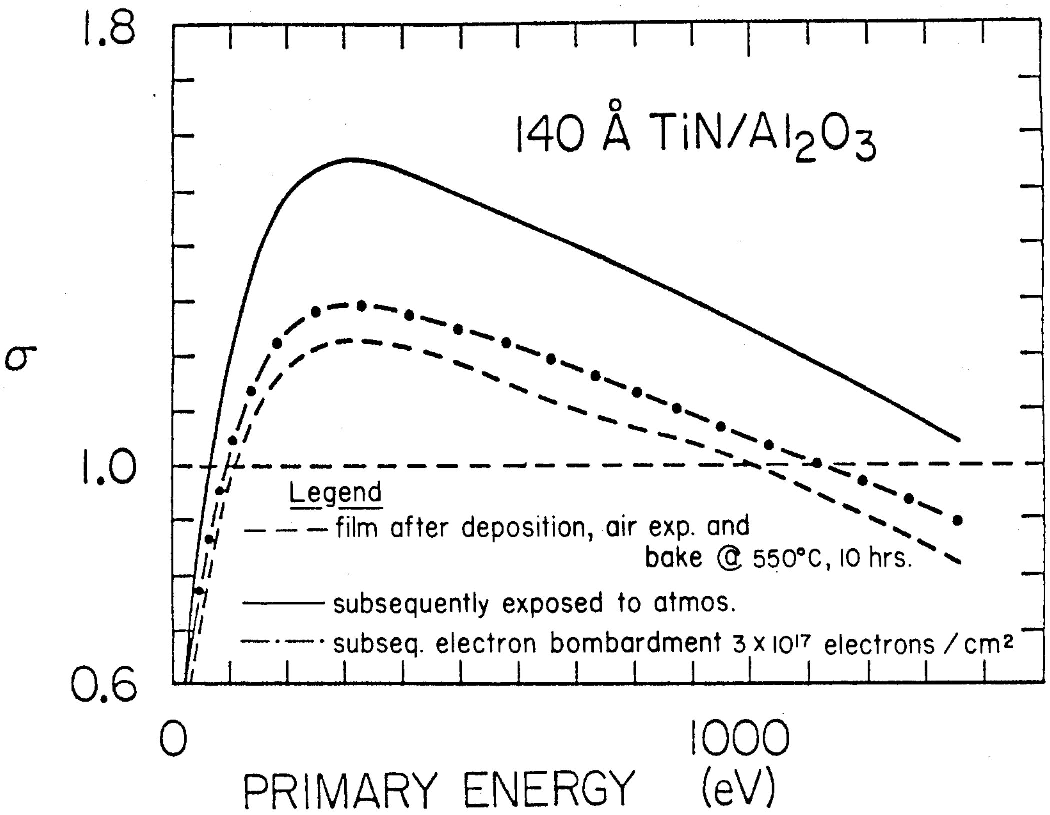
FIG. 1 shows the total Secondary Electron Emission (SEE) yield for a TiN film 140 Å thick on alumina. The legend for the plot is (----) for the film after deposition, air exposure and baking at 550° C. in Vacuo for 10 hours; (——) the film is subsequently exposed to ambient atmosphere for 1 hour: and, (– · –) the film is subsequently exposed to an electron bombardment of $3\times10^{17}$ electrons/cm$^2$.
Figure 2:
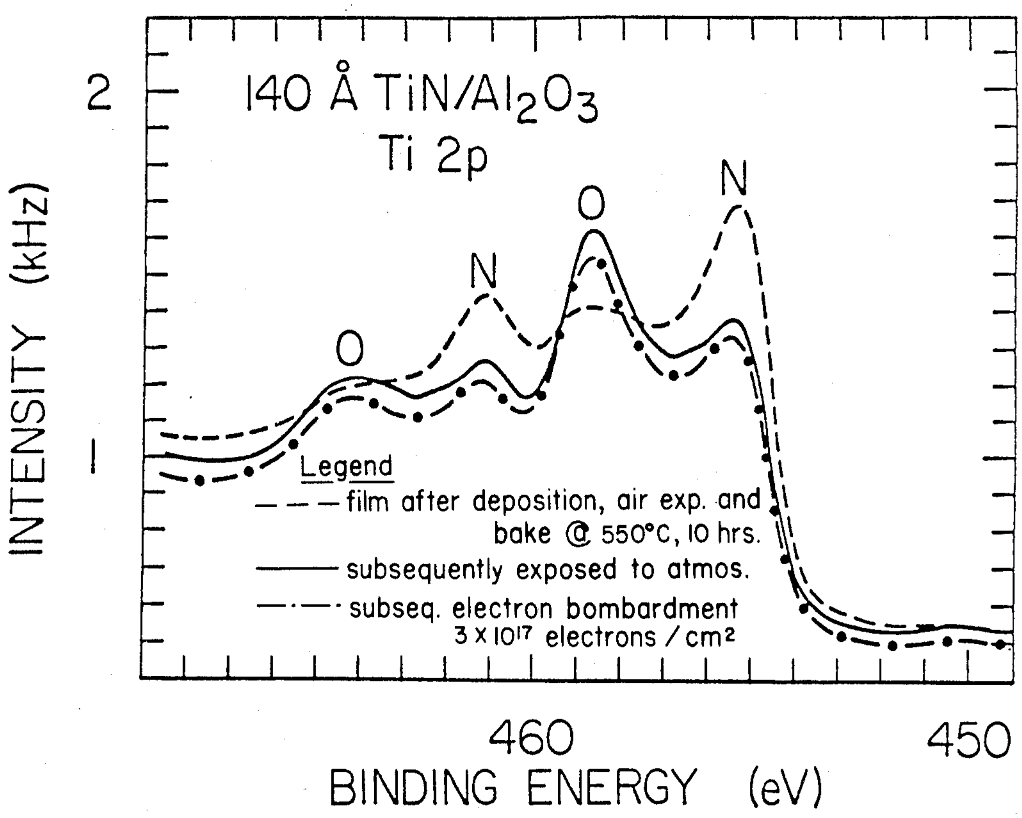
FIG. 2 illustrates the Ti 2p XPS core levels for the conditions corresponding to the legend of FIG. 1.
Figure 3:
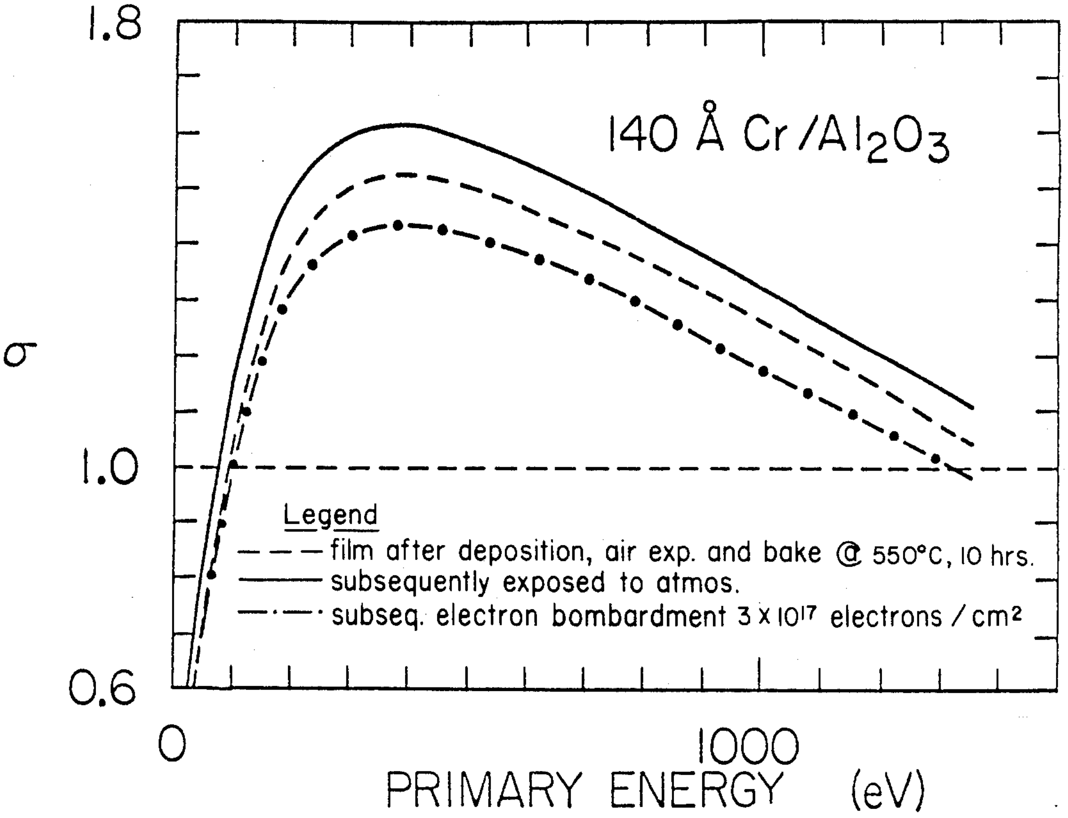
FIG. 3 shows the total SEE yield for a chromium film 140 Å thick on alumina, with the same conditions and legends as in FIG. 1.
Figure 4:
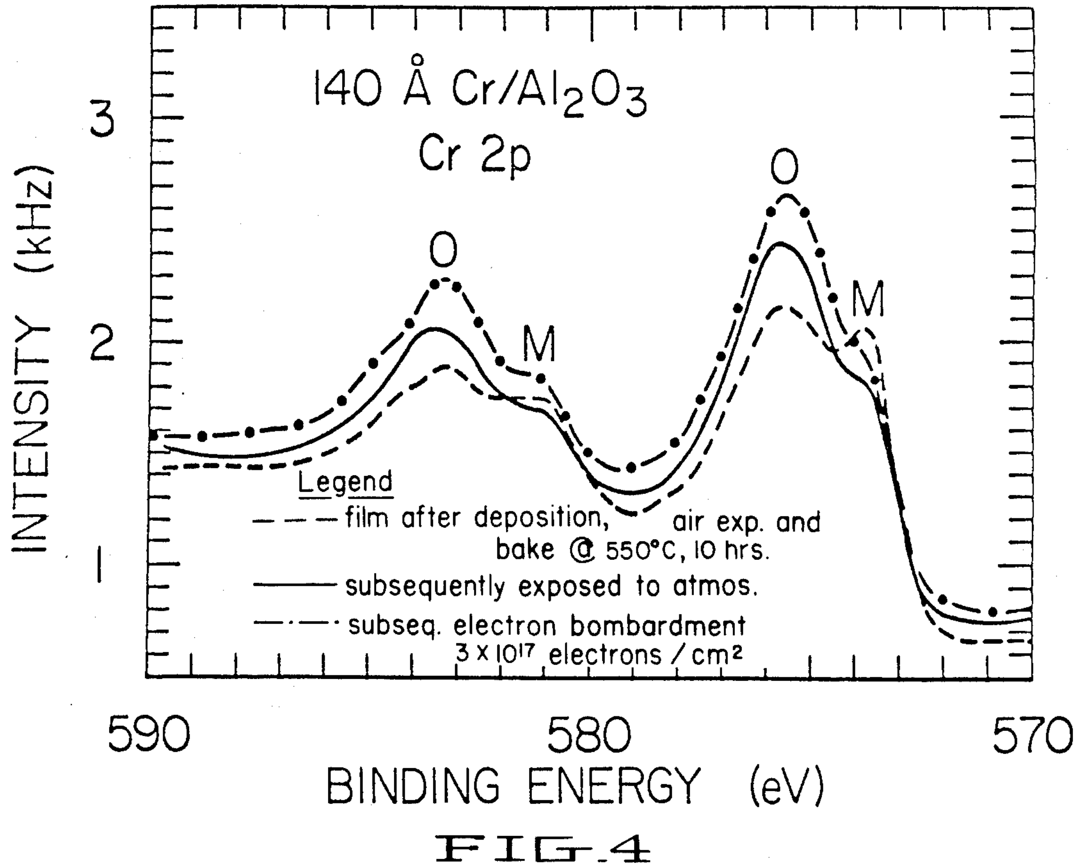
FIG. 4 shows the Cr 2p XPS core levels for conditions corresponding to the legends of FIG. 3, "O" representing oxide, "M", metal.

The present invention involves coating a ceramic high power klystron window and its sleeve with a film of air-oxidized chromium having a thickness of up to about 200 angstroms. The ceramic is typically alumina ($Al_2O_3$) but sapphire and beryllium oxide windows are also intended to be within the scope of this invention. The thin stabilized film is intended to reduce both multipactor and ohmic losses due to the limited conduction of the thin air-oxidized chromium film.

The chromium film is deposited on the ceramic window according to known methods of metal deposition.

Physical vapor deposition techniques may be used to deposit the chromium metal film on the ceramic substrate. By way of example, rather than limitation, evaporation, sputtering, ion plating and other known techniques may be used. In a preferred embodiment DC deposition techniques are used. The deposition of the chromium takes place in a non-oxidizing or inert atmosphere so that pure chromium metal is deposited. In one example, a film of chromium 140 Å thick was produced by magnetron sputtering from an electrodeposited 99.99%-pure chromium target. The operating pressure was $5\times10^{-3}$ Torr Ar at 0.2 A discharge current, 300 V applied voltage, 0.1 m target-substrate separation at a deposition rate of 3.5 Å/sec.

A more complete description of DC deposition methods can be found in (for example) Thin Solid Films 86 (1981) 267–277 which is hereby incorporated by reference.

Other physical vapor deposition techniques may be used.

The present invention provides for deposition of chromium metal in an inert or non-oxidizing atmosphere, followed by air oxidation. It has been found that this procedure provides for a more stable film under klystron operating conditions. Since oxidation occurs after film deposition, it is easier to control stoichiometry, the surface layers being subject to oxidation while the underlying chromium is physically masked from the oxidizing atmosphere. In depositing chromium on the ceramic substrate, so-called reactive sputtering techniques must be avoided. When reactive sputtering techniques, such as the one described in "R. F. Sputtered Chromium Oxide Coating for Wear Application," Thin Solid Films 64 (1979), 231–41, are used to create films of chromium oxide, it is extremely difficult to control the stoichiometry of the deposited layer.

According to the present invention, a thin chromium metal film is first applied to the ceramic window in a nonoxidizing atmosphere, for example, argon. Subsequently, the chromium film is exposed to room air for approximately twelve hours at 24° C. to form the desired oxide. Next, the air-oxidized film is heated to about 550° C. and that temperature is maintained for at least two hours. Although longer heating times may be used, it is shown below that little or no benefit can be expected from this increase in heating time.

It is also necessary to control the air-oxidized chromium film thickness to obtain the desired benefits. The film must be sufficiently thin to leave enough conductivity to leak out charges which otherwise lead to arcing or window failure. The film must also be sufficiently thick to prevent multipactoring. The air-oxidized film thickness should be less than 200 Å, preferably between 20 and 150 ÅA.

The ceramic substrate onto which the chromium film is deposited must be clean and may be prepared by conventional cleaning techniques, e.g., organic solvent washes. No other particular preparation is necessary to practice this invention.

It is also known that ceramic klystron windows comprise a ceramic section and a sleeve which is made of copper, coppernickel alloys, kovar or stainless steel. The present invention contemplates that both sections of the klystron window, the ceramic and the metal sleeve are coated with a thin, stabilized chromium oxide film.

The thin chromium oxide film of the present invention provides a more stable film than the titanium nitride film of the prior art, particularly for high power klystrons. The following examples illustrate this improved stability through photoelectron spectroscopy (XPS) and secondary electron emission (SEE) data. This data shows that, for air-oxidized chromium films, the SEE yield is more stable under simulated tube processing conditions than for TiN films and, in addition, Cr-coated windows are capable of withstanding operation at 100 Mwatt of rf power with 6 $\mu$ sec pulses without thermal-or multipactor-induced failure.

EXAMPLE 1

Sample Preparation

The substrates used for surface analyses were 1 cm diameter × 0.06 cm thick discs of 99.5%-pure alumina. The substrates are mounted in a 1.6 cm diameter ×0.5 cm thick Nb carrier for (in vacuo) transfer to the sample carousel. 140 Å thick TiN films were sputtered onto ambient temperature substrates using a Kaufmann ion source bombarding a 99.0%-pure compacted power TiN target with $7\times10^{-5}$ Torr Ar, a deposition rate of 0.3 Å/sec and 1500 eV ion energy. The 140 Å Cr films were produced by magnetron sputtering from an electrodeposited 99.99%-pure Cr target. The operating pressure was $5\times10^{-3}$ Torr Ar at 0.2 A discharge current, 300 V applied voltage, 0.1 m target-substrate separation at a deposition rate of 3.5 Å/sec.

A thickness of 140 Å was chosen because this is sufficiently thick to prevent backscatter contribution (from the substrate) to the yield measurements. In addition, they appear as bulk layers for XPS and AES measurements. Since the layers did not oxidize through, they were effective in preventing charging during measurement.

Samples were oxidized by exposure to room air at 24° C., 50% R.H. Electron bombardment of the layers was done using a scanning electron gun at 500 eV and 100 nA beam current covering 1 $cm^2$ at the sample. The sample during bombardment was biased at +70 V relative to the chamber for an effective electron energy of 570 eV and a current density of $1\times10^{-3}$ $A/M^2$.

Surface Analysis System

Samples were analyzed in an ion-pumped, baked ultrahigh vacuum system ($P<3\times10^{-10}$ Torr) incorporating XPS, AES, ELS, and total secondary electron emission yield ($\sigma$) techniques. Measurements utilized very low probe currents and counting techniques to minimize electron $\sigma$ damage to the oxides. No such damage was observed.

SEE yield measurements were done via the retarding potential difference method (V. E. Heinrich, Rev. Sci. Instrum. 45, B61 (1974)) at 2 nA primary electron current density of $2\times10^{-3}$ $A/m^2$. Binding energy references for XPS are the Pd Fermi edge (BE=0) and the Ag $3d_{5/2}$ core line (BE =368.2 eV). The x-ray anode used was Mg $K\alpha_{1,2}$ ($h\nu=1253.6$ eV) at 240 watts anode input power. The electron energy analyzer imaged a 4×4 $mm^2$ area of the sample during analysis. Close monitoring of binding energy references and power supply linearity assure that the binding energy values presented here are accurate to ±0.1 V.

Results

To simulate the sequence of events which occurs in tube processing, the Cr and TiN films are sputtered onto clean substrates, exposed to air for approximately 12 hours and inserted into the surface analysis chamber. They are heated for 10 hours at 550° C. although we have found that 2 hours are sufficient to substantially complete any thermally induced changes that occur. The sample is analysed for $\sigma$, AES and XPS; in that order because $\sigma$ is most sensitive to surface condition. The sample is transferred to a load lock and exposed to room air for 1 hour, pumped, and reanalyzed. To investigate the effects of conditioning, the sample is bombarded by $3\times10^{17}$ electron/cm$^2$ and again re-analyzed.

FIGS. 1-4 show the results of this sequence for $\sigma$ and the XPS 2p core levels of Cr and Ti. The improved stability of Cr over TiN is quite apparent in the SEE yield. The source of this stability is discussed further in this paper. $\sigma$ for Cr, although not as low as that for TiN, is adequate to prevent multipactor. The AES results for TiN/alumina indicate nothing more than oxygen gain/loss during these cycles (shown by the XPS results also), however, the Ti and N AES lines overlap, making them difficult to interpret compared to the XPS Ti and N core lines.

Figure 5:
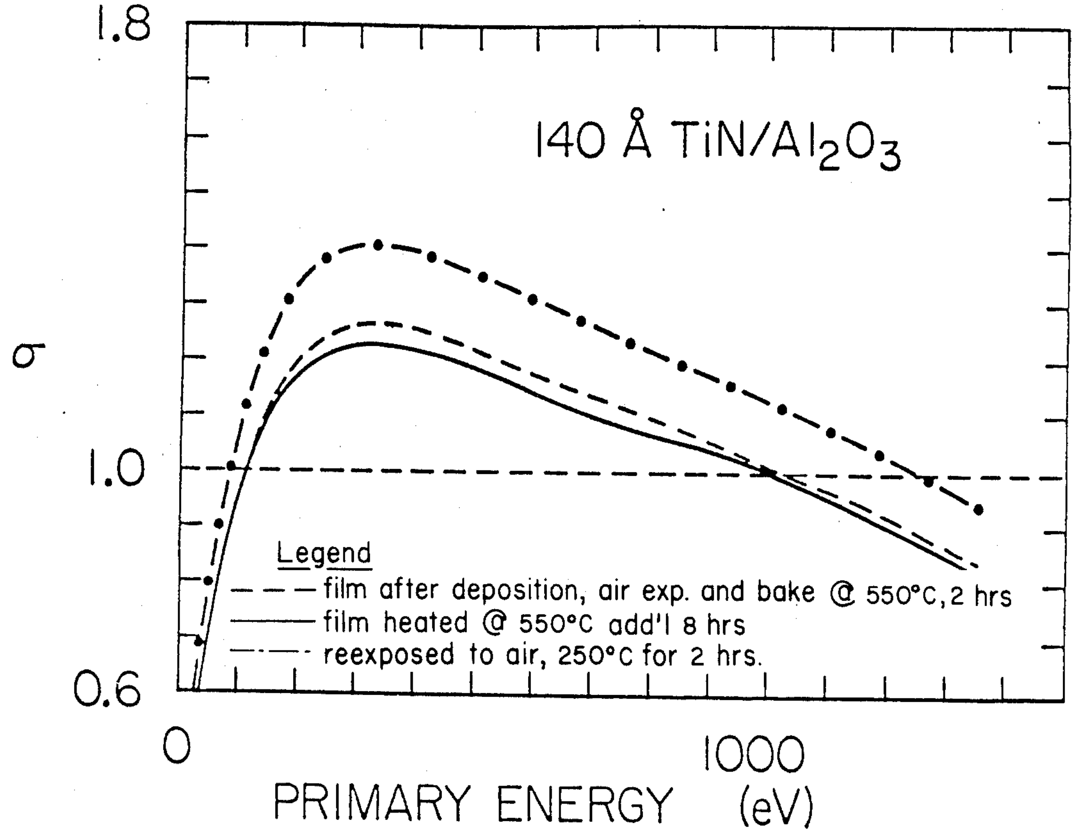
FIG. 5 shows the total SEE yield for a TiN film 140 Å thick coated on alumina. The legend for the plot is (----) for the film after deposition, exposure to air and heating to 550° C. for 2 hours; (——) the film is heated at 550° C. for 8 hours further; and, (– · –) the film is reexposed to air and heated to 250° C. for 2 hours.
Figure 6:
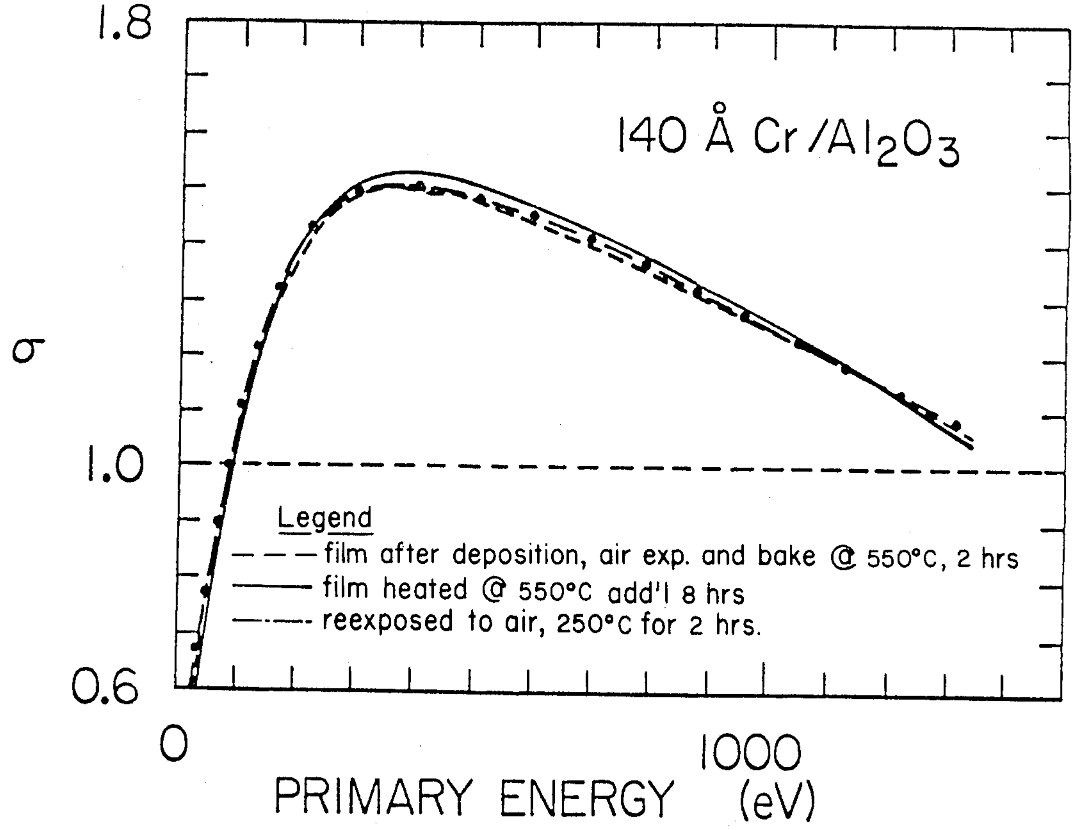
FIG. 6 shows the total SEE yield for a chromium film 140 Åthick on alumina, with the same conditions and legends as in FIG. 5.

The thermal stability of Cr oxide is readily apparent in FIGS. 5 and 6 where the SEE yield for Cr is unaffected by bake temperature or time, once surface gases have desorbed. It should be emphasized that in addition to thermal stability and low $\sigma$, these window films must have a high enough surface resistance (100 m$\Omega$/square) to limit rf losses at the window surface.

It is useful to determine the changes in chemical states which lead to the stability in the Cr layer and relative lack of it in the TiN layer. Accordingly, the core level spectra in both the oxidized and oxidized/heated configurations for each type of layer have been curve-fitted.

EXAMPLE 2

Briefly, the curve fitting procedure is as follows. Each core level is doubled by the spin-orbit splitting with a well-defined energy separation and intensity ratio between the peaks. The experimental spectra of FIGS. 7, 9, 12 and 14 will contain at least four peaks, oxide and metal for Cr and oxide and nitride for TiN. From other XPS core level measurements that were made, the position, separation and intensity ratios for clean Ti, TiN, $TiO_2$, Cr and $Cr_2O_3$ spin-orbit-split peaks are known. These clean spectra are used for starting conditions to fit the experimental data. The theoretical peaks for the fit have a Doniach-Sunjic lineshape (J. Phys.C. 3, 285 (1970)) characterized by parameters such as halfwidth, energy position, asymmetry, phonon broadening and background, all of which may be entered as variables. The theoretical lineshapes are convolved with the Mg x-ray lineshape and electron energy analyzer transmission function. The computer program doing the fit is constrained to move by fitting peaks in pairs in order to reflect the spin-orbit splitting constraint. The program uses an analytical solution to a linearized fitting function with a gradient search in N-dimensional parameter space to find the lineshape values which give the smallest value reduced chi-squared ($\chi^2$) fit to the raw data. A perfect fit has a reduced $\chi^2$ of one but very good fits are characterized by reduced $\chi^2$ of less than two.

Figure 7:
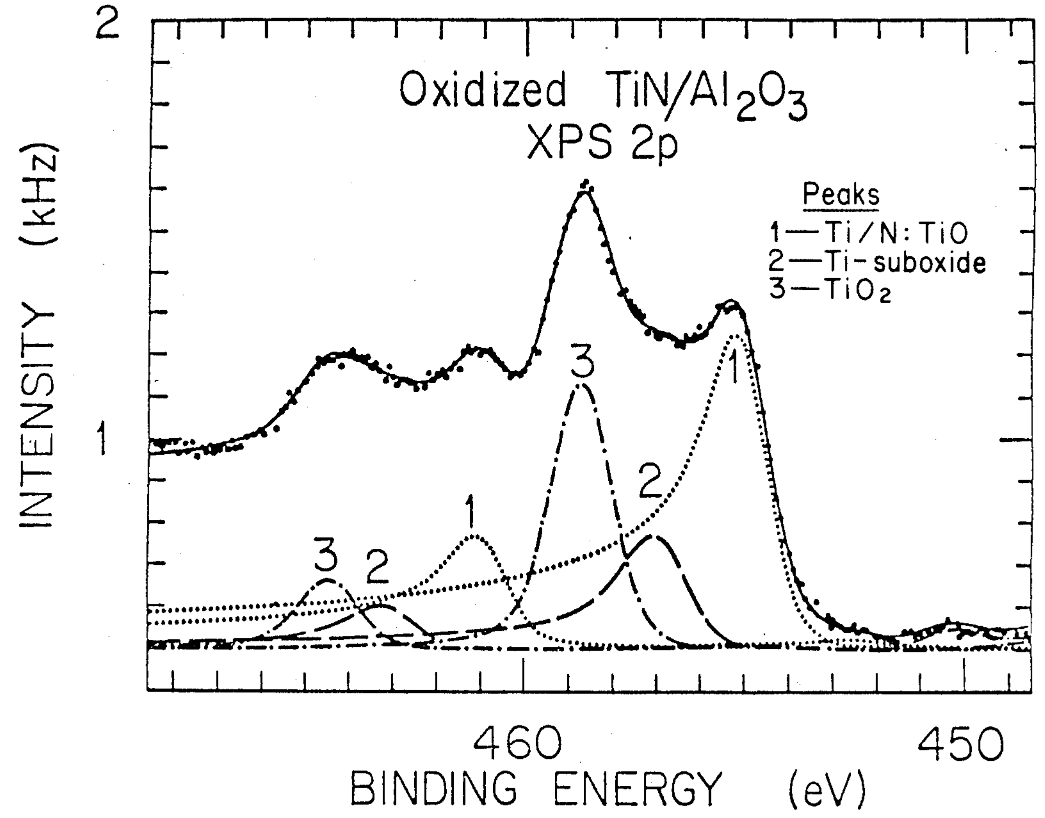
FIG. 7 shows the Ti 2p XPS core levels for TiN film exposed to air overnight. The peak labeled "1" is for TiN/TiO; peak 2 is Ti-suboxide; and peak 3 is for $TiO_2$.
Figure 8:
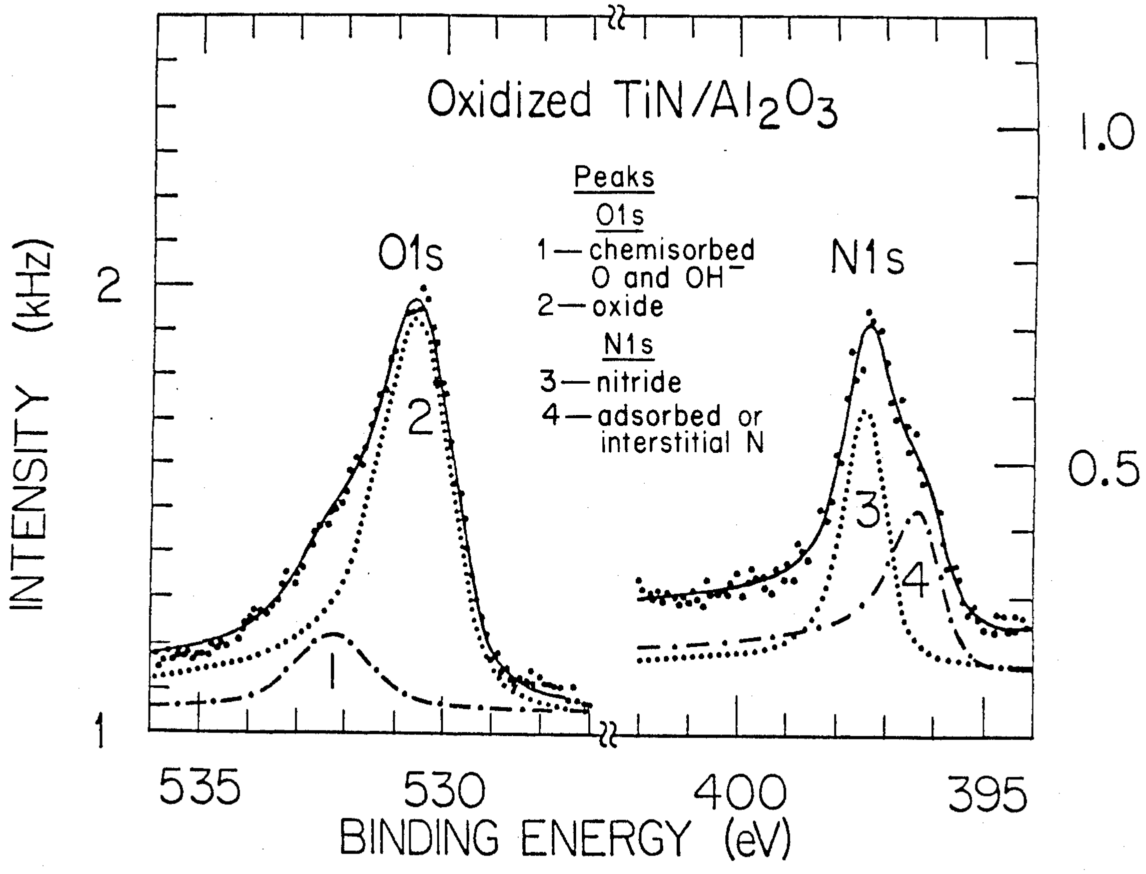
FIG. 8 shows the Ti 2p XPS core levels for a TiN film exposed to air overnight. For the O 1s plot, peak 1 is for chemisorbed O and $OH^-$and peak 2 is for oxide. For the Nls plot, peak 3 is for the nitride, peak 4 is for the adsorbed or interstitial N.
Figure 9:
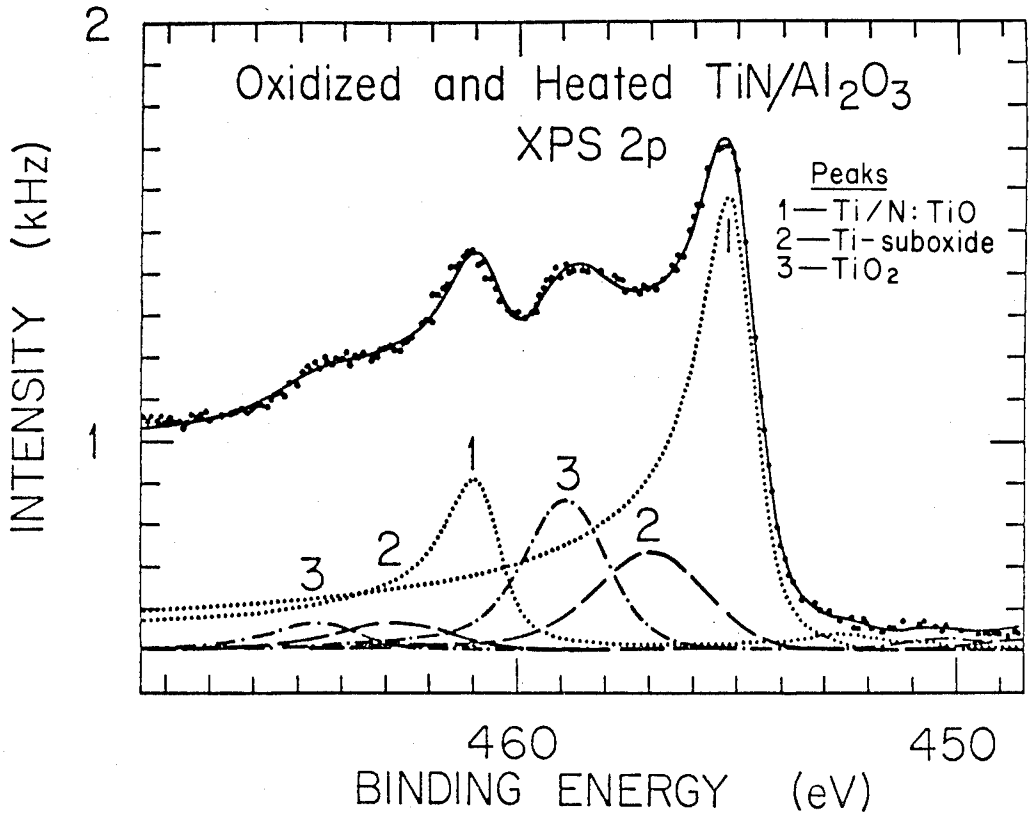
FIG. 9 shows the Ti 2p XPS core levels for the film examined in FIGS. 7 and 8, following oxidation and heating at 550° C. for 10 hours and follows the same peak identification as in FIG. 7.
Figure 10:
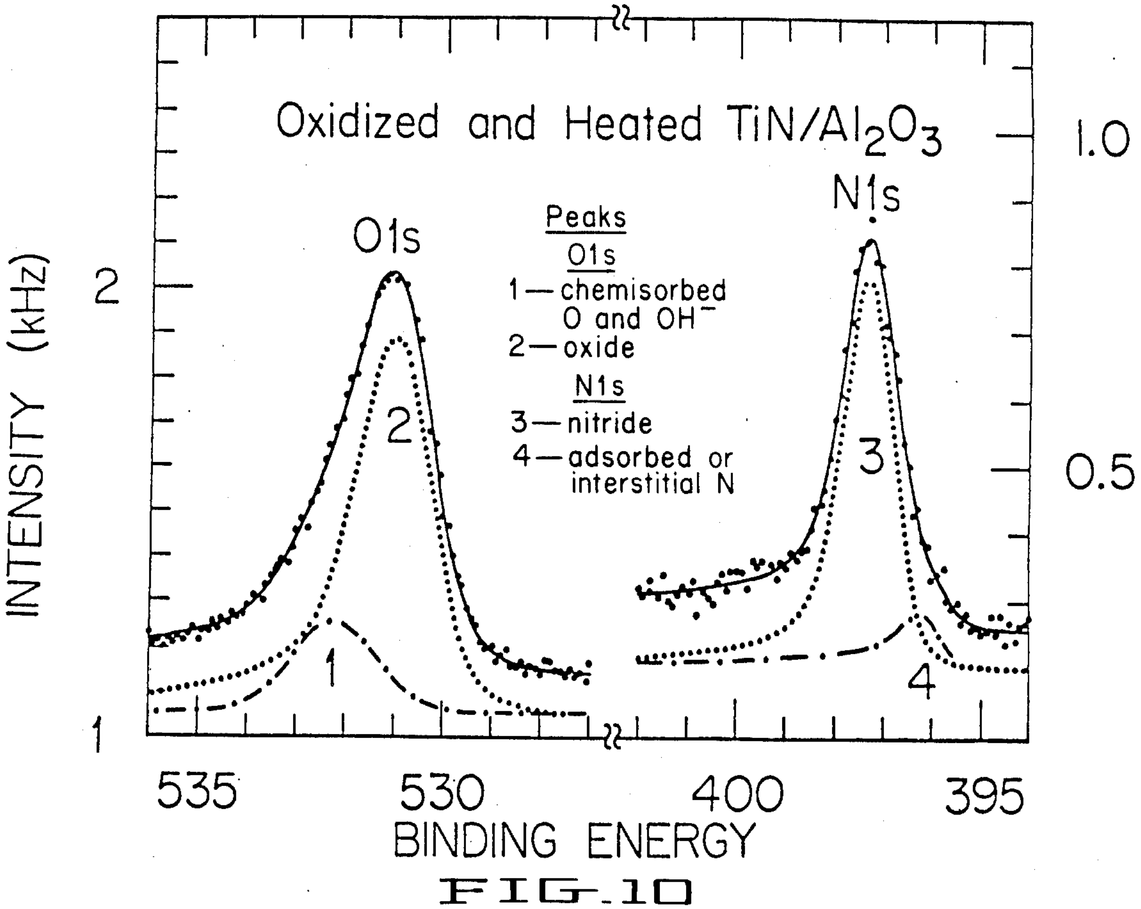
FIG. 10 shows the Nls XPS core levels for the film examined in FIG. 9 following the same peak identification as in FIG. 8.

The critical steps in tube processing are the air exposure and bakeout. Using curve fitting, we examine the chemistry that occurs on our model surfaces for both TiN-and Cr-coated alumina. First we consider the TiN layer. FIG. 7 is the Ti 2p core spectrum for a 140 Å TiN layer (on $Al_2O_3$) which has been exposed to air overnight (although this spectrum is not significantly different from a 1 hour air exposure). FIG. 9 is a Ti 2p spectrum for that surface heated to 550° C. for 10 hours and allowed to cool to room temperature prior to taking the spectra. FIGS. 8 and 10 are the O 1s and N 1s core levels corresponding to FIGS. 7 and 9.

The sequence of events which occurs, as will be shown, is the following: The TiN, upon air exposure, oxidizes to 2-3 monolayers of $TiO_2$. There is evidence for the existence of sub-oxides of Ti, particularly TiO, presumably all located between the $TiO_2$ and TiN. The N freed as a result of oxidation apparently remains below the $TiO_2$ layer, possibly interstitially or in the grain boundaries. Additionally, there is some $H_2$, $CH_2$, CO, $CO_2$ and water ($OH^-$) adsorbed on the surface.

During heating to 550° C. the adsorbed gases desorb and some of the $TiO_2$ dissociates and is converted back to TiN by recombination with the trapped N. This results in a sharp drop in the secondary electron yield, $\sigma$, due to gas desorption and/or conversion from $TiO_2$ to a more TiN-like surface layer. The entire sequence of events can be repeated if this surface is again re-exposed to air.

When Cr layers on alumina are exposed to air and heated in the same manner as TiN layers, the results are rather simpler. The Cr-oxide formed is 8 monolayers thick and reduces to 6 monolayers during heating. $H_2$ is desorbed with little else. Subsequent air exposure leaves the surface essentially unchanged.

Conclusion

The results for TiN/alumina show that the large changes seen in $\sigma$ for this layer is due to thinness of the $TiO_2$ layer formed during air exposure. This $TiO_2$ is subject to decomposition on heating and, since the secondary emission coefficient is very different for TiN and $TiO_2$, the result is a widely varying $\sigma$ under typical klystron processing conditions.

The corrosion layer on Cr/alumina is considerably thicker and relatively stable under heating. The apparently highly defective nature of the $Cr_2O_3$ layer is responsible for the relatively low secondary yield (compared to other insulators) of the coated windows.

In order to identify the various curve fit components, we have measured reference XPS spectra for air-oxidized Ti($TiO_2$) and Al($Al_2O_3$), clean Ti and TiN, and clean Cr and $Cr_2O_3$. Where necessary, these reference spectra have been curve fit using the above-described procedure, the binding energies and peak areas determined and the results for the standards compared to the literature for confirmation. Table I presents the results for these reference peaks, giving the binding energy positions, areal ratios and literature references where available.

TABLE I

| | XPS References | | | | | | |
|---|---|---|---|---|---|---|---|
| Surface | 2p3/3 | OLs | N 1s | Ti/O | Ti/N | Cr/O | Literature |
| Ti[(a)] | 454.0 | — | — | — | — | — | 454.0[(1)] |
| $Al_2O_3$[(b)] | — | 532.5 | — | — | — | — | 532.4[(2)] |
| TiN[(c)] | 455.0 | — | 397.3 | — | 4.21 | — | 455.1[(3)] |
| | | | | | | | 397.4[(3)] |
| $TiO_2$[(d)] | 459.3 | 531.0 | — | 1.06 | — | — | 458.9[(1)] |
| | | | | | | | 530.4[(1)] |
| Cr[(c)] | 574.5 | — | — | — | — | — | 574.0[(4)] |
| $Cr_2O_3$[(e)] | 577.0 | 530.9 | — | — | — | 1.54 | 576.8[(5)] |

TABLE I-continued

| | XPS References | | | | | | |
|---|---|---|---|---|---|---|---|
| Surface | 2p3/3 | OLs | N 1s | Ti/O | Ti/N | Cr/O | Literature |
| | | | | | | | 530.6[(6)] |

[(a)]Evaporated film
[(b)]Air-oxidized evaporated film
[(c)]Sputter deposited
[(d)]Air-oxidized film of a)
[(e)]Wet-$H_2$-fired sputter-deposited film, confirmed by x-ray diffraction.
[(f)]Adjusted to Ag $3d_{5/2}$ = 368.2 eV, Au$4f_{7/2}$ = 84.0 eV or adventitious carbon at 285.0 eV, as required.
[(1)]L. Porle, M. Demosthenous and Trnns Minh Duc, J. Less Common Met. 56, 183 (1977).
[(2)]M. Textor and R. Grauer, Corrosion Sci. 23, 41 (1983).
[(3)]H. Hochst, R. D. Bingans, P. Steiner and Th. Wolf, Phys. Rev. B25, 7183 (1982).
[(4)]J. A. Leiro and E. E. Minni, Phil. Mag. B 49, L61 (1984).
[(5)]I. Ikemoto, K. Ishii, S. Kinoshita, H. Kuroda, M. A. Alario Franco and J. M. Thomas, å. Sol. State Chem. 17, 425 (1976).
[(6)]G. Gewinner, J. C. Pruchetti, A. Jaegle and A. Kalt, Surf. Sci. 78, 439 (1978).

Oxidized TiN/$Al_2O_3$

Examination of the Ti 2p spectra of FIG. 7 shows the readily-identifiable presence of $TiO_2$ and TiN. There is also the possible presence of Ti-sub oxides at ~457 eV which might also be Ti-oxynitride. (R. S. Robinson and P. M. A. Sherwood, Surf. and Inter. Anal 6, 261 (1984)). If present, TiO occupies the same energy position as TiN. (L. Pork, M. Demosthenous and Tran Minh Duc, J. Less. Common Met. 56, 183 (1977)). The largest peaks in the O 1s and N 1s spectra of FIGS. 8 and 10 are due to oxides and nitride of Ti. Except for the possible presence of O 1s from chemisorbed oxygen or OH, (M. W. Roberts, in *Advances in Catalysis*, Vol. 29, Academic Press, New York (1980)), no other peaks of oxygen or carbon for absorbed gases were observed in XPS and less than 1% of a monolayer of C observed in AES.

Since only one peak is likely present at the $TiO_2$ position, the analysis starts at that point. If the $TiO_2$ of FIG. 7 has the same Ti/O areal ratio as the reference $TiO_2$, then there is excess oxygen present in FIG. 8, O 1s 530.5 eV. Assuming that the same XPS atomic sensitivity can be used for both $TiO_2$ and its other oxides, the excess oxygen could be assigned to TiO and, say, $Ti_2O_3$. Similarly, the N 1s peak at 397.4 eV of FIG. 8 is due most likely to TiN. Using the reference areal ratio for TiN shows an excess of Ti peak area at the 455.2 eV position of FIG. 7. If the excess Ti is assumed to be combined with the Ti core peak at 457.1 eV to determine the likely Ti-sub oxide stoichiometry. In fact, that final quantity turns out to be Ti/O=1 .59, i.e., close to $Ti_2O_3$ whose Ti/O areal ratio (compared to $TiO_2$ at 1.06) would be 1.42.

The presence of Ti-oxynitride as the source of the Ti core peak at 457.1 eV seems unlikely because a N 1s peak at around 398.4 eV would also rise (K. S. Robinson and P. M. A. Sherwood, Surf. and Inter. Anal. 6, 261 (1984)) and none is observed here. Using the areas measured here for the $TiO_2$ reference and the $TiO_2$/TiN overlayer, a calculation of the $TiO_2$ overlayer thickness yields 8.8 Å or about three monolayers. Dry $O_2$ oxidation of TiN at 550° C. has been shown to result in the formation of rutile $TiO_2$ (M. Witmer, J. Noser and H. Melchoior, J. Appl. Phys. 52, 6659 (1981)). Table II presents the energies and areas measured for the various peaks used in the analyses for both the oxidized and the oxidized and heated TiN surfaces.

Focussing attention on the O 1s and N 1s spectra of FIG. 8, we find the major O 1s peak at 530.5 eV which is characteristic of Ti-oxide and was used to make the above analyses. The smaller peak at 532.2 eV is due to the alumina substrate (in addition to chemisorbed oxygen) for the simple rasons that there is a very small Al 2p peak detectable as well. Using the reference Al/O areal ratio for $Al_2O_3$ covered by a 140 Å TiN/$TiO_2$ overlayer, the Al/O ratio for O at 532.2 eV should be ~1.25. The measured ratio is 0.5 for the oxidized surface and 0.37 for the oxidized and heated surface. That indicates that there is O 1s intensity present due to chemisorbed oxygen and/or water (hydroxyls).

The N 1s spectrum of FIG. 8 has two peaks, one of which is clearly TiN and the other of which could be assigned to chemisorbed N (M. W. Roberts, in *Advances in Catalysis*, Vol. 29, Academic Press, New York, (1980)), interstitial N, or possibly N in the grain boundaries. Adsorbed N seems unlikely because (1) surface N would likely be replaced by hydroxyls and hydrocarbons during the air exposure and, (2) if present on the surface in other forms, e.g. NO, would produce a peak at higher binding energy than that observed. Interstitial N or possibly N trapped in grain boundaries is appealing in view of a model of growth of $TiO_2$ which moves inward into the TiN film and traps the N released by oxidation of TiN, at least at room temperature. Also, the very long asymmetric kinetic energy loss tail on the 396.4 eV N 1s peak suggests a sub-surface origin for this component, just as a similar loss tail is seen in the Ti-sub-oxide peak of FIG. 7.

Oxidized and Heating TiN/$Al_2O_3$

The oxidized TIN/$Al_2O_3$ was positioned near the entrance of a quadrupole mass spectrometer and heated radiantly from the reat by a W pancake filament. The gases observed desorbing from the sample and holder were $H_2$(40%), CO(24%), Ar(23%), $H_2O$(6%), $CH_4$(4%) and $CO_2$(3%). The Ar was probably incorporated into the TiN during deposition. The coverage on the sample prior to heating was low for carbon-containing molecules, as pointed out previously.

FIGS. 9 and 10 and Table II show: (1) a drop in the Ti core for $TiO_2$; (2) a rise in the Ti core for TiN/TiO: (3) an 0.5 eV shift to higher binding energy for O 1s from oxide; (4) a transfer of N 1s intensity from the interstitial state into the nitride state; (5) a rise in the total N 1s peak area;(6) a small drop in the O 1s oxide peak area and, (7) a small increase in the Ti peak area at 457.0 eV as well as a broadening of that peak. Again, no extra peak is observed to appear in the N 1s core level which might indicate the presence of oxynitrides. Attempting to carry out an areal ratio analysis like that for the oxidized surface, the following is determined. Assuming again that all the Ti intensity at 458.9 eV is due to $TiO_2$, the thickness of the $TiO_2$ layer drops from 8.8 Å to 6.3 Å. If this is the case, a significant decrease in the oxygen peak in both the XPS ($\lambda$=19.7 Å) or the AES ($\lambda$=6.6 Å) is expected. A rather smaller reduction of 7% is seen in the total O 1s peak at 530.5 eV (now shifted to 531.0 eV) and almost no reduction in the AES O peak. This suggests that most of the O freed from $TiO_2$ remains in the surface region and may be there as suboxides and chemisorbed O or $OH^-$since the peak at 532.2 eV does grow as a result of heating. The discussion above about the source of the O 1s peak peak at 532.2 eV indicated that it was partly due to the alumina substrate. No change is observed in the Al 2p intensity after heating and, therefore, the increase seen in O at 532.2 eV must be due to chemisorbed O or $OH^-$.

Although the bulk melting point of TiO is 1850° C., there is evidence in the literature (E. Bertel, R. Stockbauer and T. E. Madey, Surf.Sci. 144, 355 (1984)) for $TiO_2/Ti$ layers which indicate that $TiO_2$ decomposes at 400° C. or so. The 0.5 eV shift to higher binding energy in the O 1s (oxide) and 0.2 ev shift in the Ti ($TiO_2$) suggests that the as-oxidized $TiO_2$ layer was actually somewhat oxygen-deficient and the heating breakdown of the $TiO_2$ provided adequate oxygen to make the remaining layer stoichiometric $TiO_2$.

Figure 11:
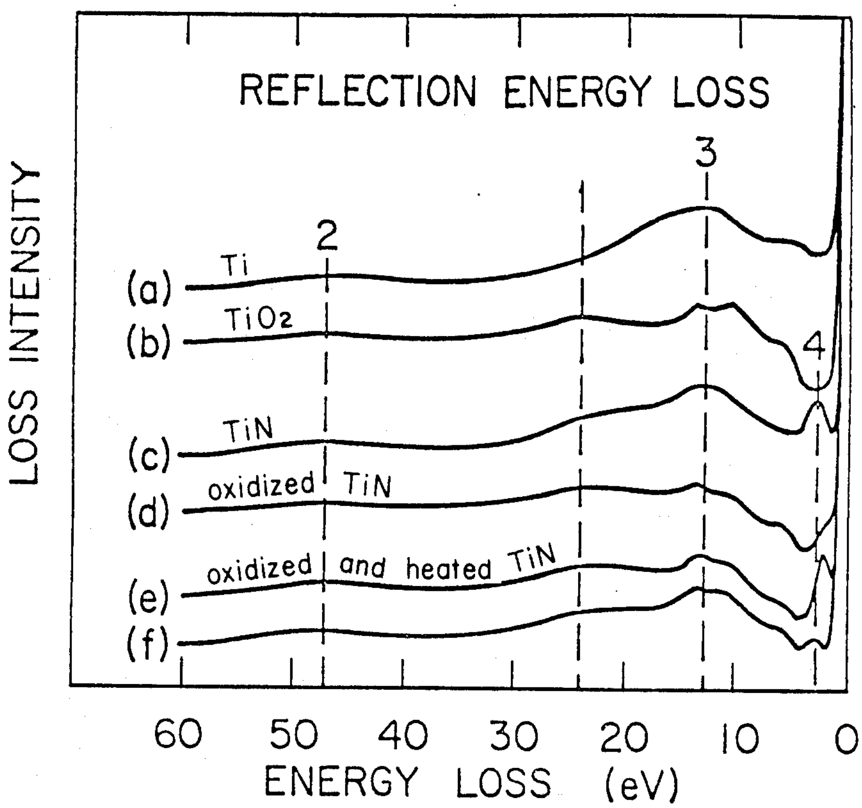
FIG. 11 is the reflection electron energy loss spectra for (a) Ti, (b) $TiO_2$, (c) TiN, (d) oxidized TiN of FIG. 7, and (e) oxidized and heated TiN of FIG. 9. (f) is the sum of (b) and (c) divided by 2. Regions "1" and "2" represent first and second order bulk plasmons, "3" surface plasmon and "4" intrabend transition.

Using the TiN areal ratio (4.21) of our reference TiN and the N 1s intensity at 398.3 eV for the heated surface indicates that there is insufficient Ti intensity at 455.2 eV in FIG. 9 to maintain this ratio, i.e., there is "too much" N. Since there is a drop in the adsorbed/interstitial N peak at 396.3 eV, the suggestion might be that the stoichiometry of the TiN after heating is different than that before. However, a change in TiN stoiciometry to higher N content should result in an increase in the binding energy difference between the Ti 2p and N 1s peaks due to an increase in charge transfer (L. Porte, L. Roux and J. Janus, Phys. Rev. B 28. 3214 (1983)). That is not observed here as both Ti and N peaks preserve their energy positions. Part of the intensity increase in the Ti (nitride) peak and the N (nitride) peak after heating is due to a thinning of the absorbing $TiO_2$ overlayer. If that thinning is taken into account, the total N 1s signal is essentially unchanged by the heating. What appears to occur is a transfer of 70% of the intensity from the adsorbed/interstitial N peak into the TiN peak located at 397.4 eV. Since that extra "TiN" N 1s intensity is not assignable to TiN, another source must be postulated. There is some broadening of the Ti-suboxide peak, so perhaps a weak oxynitride is appearing. Another possibility might be the formation of NH or something similar on the surface. FIG. 11 is a series of reflection ELS spectra for the various reference surfaces as well as the oxidized and oxidized/heated $TiN/Al_2O_3$ surfaces. Of particular interest is feature number 4 of curve (e) which appears to be a TiN-like structure but occurs at too low a loss energy. A 50-50% synthesis of $TiO_2$ and TiN (curve f) matches the rest of the curve (e) nicely, however. So feature 4 of curve (e) may represent a graded composition between the $TiO_2$ and TiN. In such a case, it might be appropriate to assign some portion of the Ti-suboxide intensity of FIG. 9 and some of the N to a weak oxynitride.

The analysis of the oxidized and oxidized/heated $TiN/Al_2O_3$ surfaces as presented above is sufficient to determine why the secondary electron yield ($\sigma$) drops after heating. Some of the drop is due to gas desorption but a portion of the drop can be attributed to the reduction of the $TiO_2$ layer thickness from 8.8 Å to 6.3 Å. Work on $SiO_2/Si$ surfaces (K. Okamoto, Rev. Sci. Instrum. 51, 302 (1980)) shows that the yield drops sharply as the oxide overlayer thickness decreases. The effect appears smaller for $SiO_2/Si$ than for our $Ti_2/TiN$ layer but $\sigma$ for the clean Si surface could not be measured and, therefore, the initial increase in $\sigma$ upon oxidation may be more rapid than can be inferred from the more heavily oxidized Si results. Also, the absolute value of $\sigma$ for Si was not measured but rather the $\sigma$ ratio for different Si-oxide layer thicknesses, making a direct comparison of our results to the Si results impossible.

Oxidized $Cr/Al_2O_3$

Figure 12:
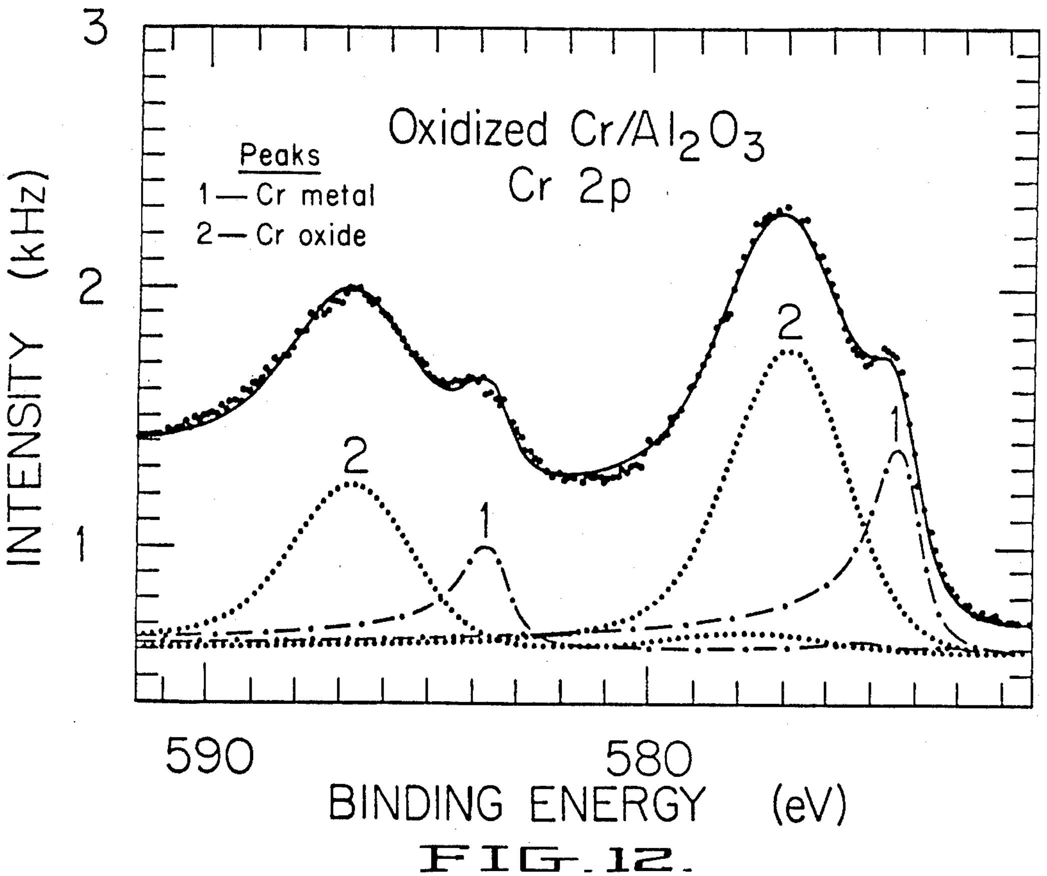
FIG. 12 shows the Cr 2p XPS core levels for a 140 Å chromium oxide film exposed to air overnight. The peak labeled "1" is for the chromium metal and "2" for chromium oxide.
Figure 13:
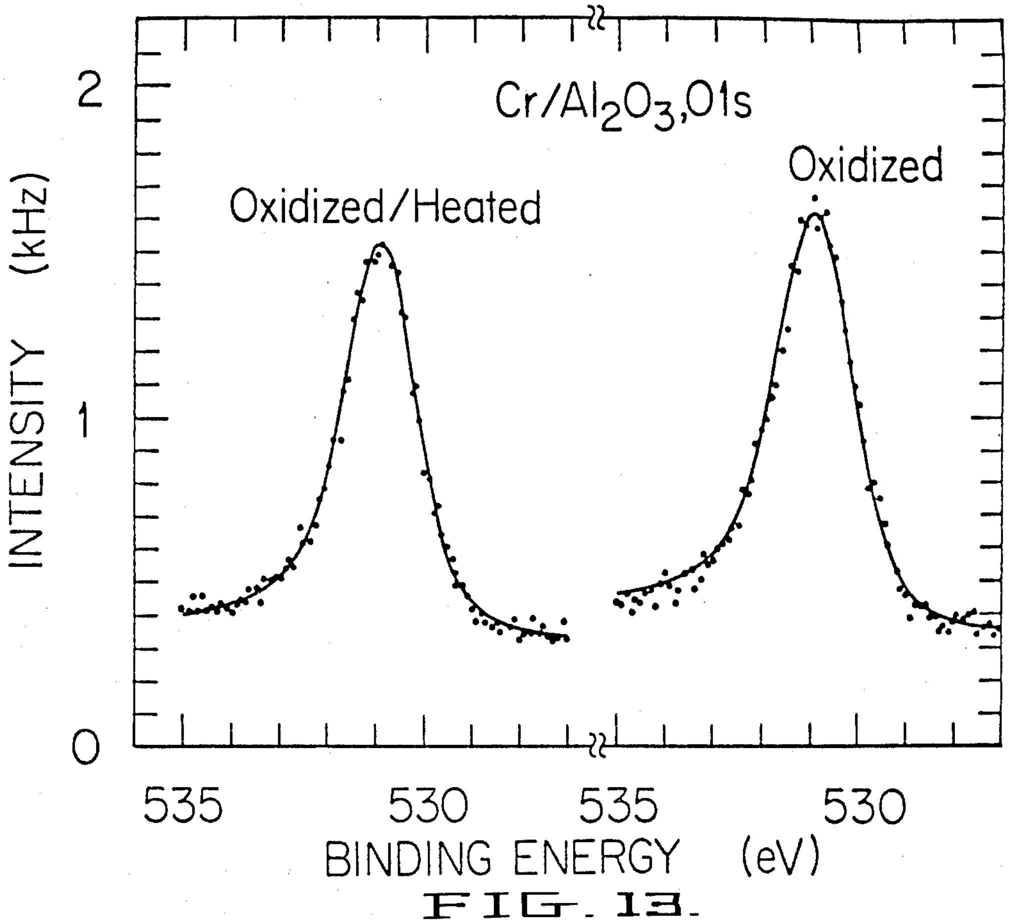
FIG. 13 shows the Ols XPS core levels corresponding to Cr levels of FIGS. 12 and 14.
Figure 14:
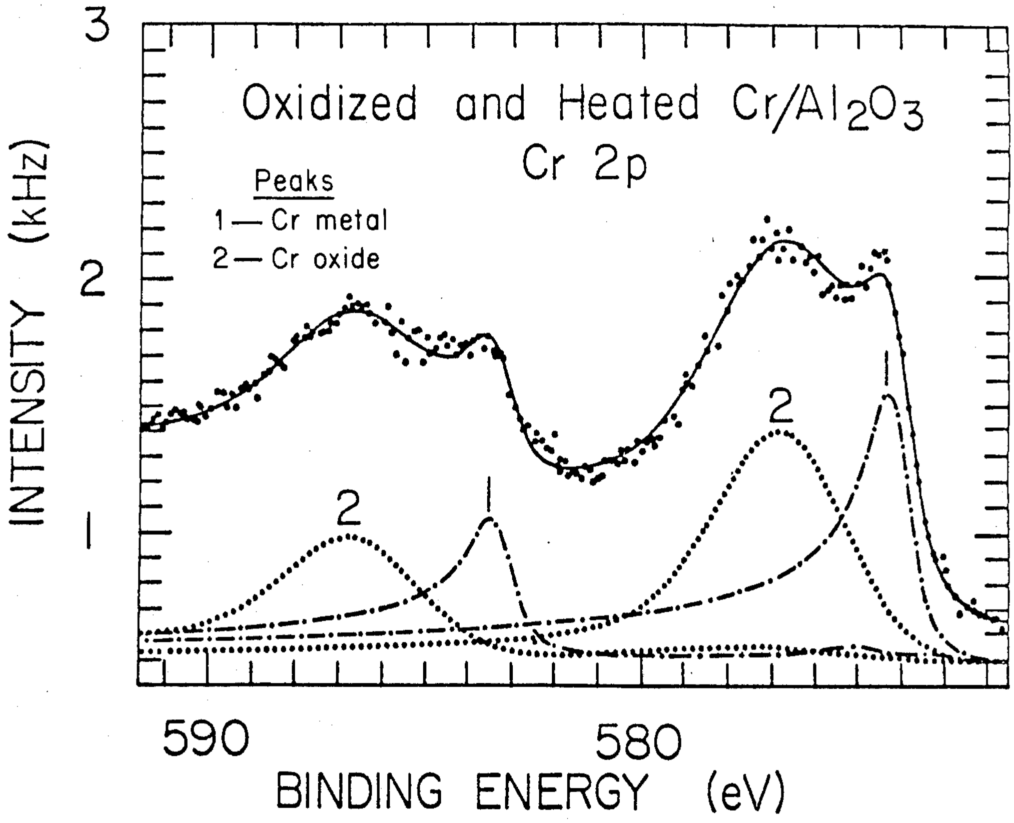
FIG. 14 shows the Cr 2p XPS core levels for the sample examined in FIG. 12, following oxidation and heating at 550° C. for 10 hours, and follows the same peak identification as in FIG. 12.

FIGS. 12-14 and Table III present the results for Cr/alumina. Examination by AES and XPS of the oxidized surface showed 5-10% of a monolayer of C present which mostly is removed during the first heating of the surface. The mass desorption spectrum showed 87% $H_2$, 5% $H_2O$, 2% $CO_2$ and 1.5% $CH_4$ leaving the sample and holder. The $H_2$ was presumably gettered by the fresh Cr film during deposition and was possibly present in the stainless sample holder.

The sequence of events involved in the oxidation and heating of the Cr layer appear straightforward. The asdeposited film (FIGS. 12 and 13) oxidizes to $Cr_2O_3$. This is supported by the binding energy position of the Cr $2p_{3/2}$ core line and by the Cr(576.9 eV)/O areal ratio, both of which agree with our $Cr_2O_3$ reference. The energy position of 576.9 eV is essentially identical with our $Cr_2O_3$ although little difference in binding energy for $Cr^{3+}(Cr_2O_3)$ and $Cr^{4+}(CrO_2)$ states has been observed (F. Garbassi, E. Mello Ceresa, G. Basile and G. C. Boero, Appl. Surf. Sci. 14, 330 (1983); C. N. R. Rao, D. D. Sarma, S. Vasudevan and M. S. Hedge, Proc. R. Soc. Lond. A 367, 239 (1970)). More to the point, $CrO_2$ is typically produced under excess O conditions and is converted to $Cr^{6+}(H_2CrO_4)$ by exposure to $H_2O$. $Cr^{6+}$would easily detectable in our Cr spectra. The Cr/O areal ratio of our references is 1.54, the oxidized Cr layer, 1.56 and the heated layer, 1.46. A ratio of 1.28 would be expected for $CrO_2$ from atomic ratio considerations. Numerous studies show that oxidation of Cr in $O_2$ or air leads to the formation of $Cr_2O_3$ (J. C. Fuggle, L. M. Watson, D. J. Fabian and A. Affrassman, Surf. Sci. 49 61 (1975); G. Gewinner, J. C. Pruchetti, A. Jaegle and A. Kalt, Surf. Sci. 78, 439 (1978); F. Watari, Surf. Sci. 110, 111 (1981)).

A calculation of the $Cr_2O_3$ layer thickness after oxidation yields 17.1 Å. A thickness of ~10 Å has been inferred from $O_2$ and air-oxidation by photoemission (K. M. Robinson and P. M. A. Sherwood, Surf. and Inter. Anal. 6, 261 (1984)) and STEM (F. Watari, Surf.Sci. 110, 111 (1981). The underlying (if indeed it is "underlying") Cr metal signal is about half that calculated for a uniform 17.1 Å $Cr_2O_3$ overlayer. Strong defect scattering in the $Cr_2O_3$ overlayer could reduce the Cr metal signal, a situation that could be expected on a rough alumina surface. The rather thick (8 monolayers) $Cr_2O_3$ would be expected to also have a lower yield than that usually expected for insulators if it is highly defective.

Oxidized and Heated Cr/alumina

Heating the oxidized Cr layer on alumina results in (a) a drop in the $Cr_2O_3$ thickness (b) an increase in the Cr metal signal; (c) a small drop in the O signal; and (d) a drop in the Cr/O ratio from 1.56 to 1.46. The results are presented in Table III. The new $Cr_2O_3$ thickness is 13.3 Å and, again, the Cr metal underlayer signal is smaller (60% of that expected). This improvement in the underlayer signal may be due to the annealing out of defects and general improvement in the $Cr_2O_3$ film quality. Indeed, there is a reduction in the secondary electron background in the XPS spectra following the heating cycle (compare FIGS. 12 and 14 and see FIG. 13).

Since there is no change in the binding energies of the Cr and O core lines, no further chemistry takes place during heating but the rearrangement occuring is responsible for the drop in Cr (576.9 eV)/O areal ratio. Indeed, the total Cr (metal plus oxide) signal is unchanged by the heating. It is possible that the slight drop in O signal may be due to desorption of chemisorbed O or OH− but the binding energy for such a species would have to coincide with that for the oxide.

While a specific embodiment of the apparatus and film has been illustrated and described for coating an alumina window in accordance with this invention, modifications and changes of the apparatus, parameters, materials, etc. will become apparent to those skilled in the art, and it is intended to cover in the appended claims all such modifications and charges which come within the scope of this invention.

We claim:

1. A coated ceramic RF window and metal sleeve of a klystron comprising a stabilized chromium oxide film less than 200 angstroms thick deposited on a ceramic RF window and metal sleeve.

2. The coated ceramic RF window and metal sleeve of a klystron of claim 1 wherein said RF window is formed of a ceramic selected from the group consisting of alumina, sapphire and beryllium oxide.

3. The coated ceramic RF window and metal sleeve of a klystron of claim 1 wherein said film thickness is between 20 and 150 Angstroms.

4. In a high power klystron of at least 50 megawatts, having a ceramic RF window and metal sleeve, the improvement comprising:

a stabilized film of chromium oxide, less than 200 Angstroms thick, said film deposited on the ceramic RF window and metal sleeve by physical vapor deposition of chromium in a non-oxidizing environment and subsequently oxidized in air.

5. The high power klystron of claim 4 wherein said chromium is deposited by direct current magnetron sputtering of chromium in a non-oxidizing environment.

6. The high power klystron of claim 4 wherein said window is formed of a ceramic selected from the group consisting of alumina, sapphire and beryllium oxide.

7. The high power klystron of claim 4 wherein said film thickness is between 20 and 150 Angstroms.

8. A method of applying a chromium oxide stabilized film to a ceramic RF window and metal sleeve for use on a klystron comprising A. applying a chromium film of less than 200 Å thickness in a non-oxidizing atmosphere;

B. exposing the chromium film to air to form an oxide; and

C. heating the coating to form a stabilized chromium oxide film.

9. The method of claim 8 wherein said chromium oxide is heated for approximately 2 hours at approximately 550° C.

10. The method of claim 8 wherein the chromium film is exposed to air for approximately 12 hours at approximately 24° C. to form an oxide.

11. The method of claim 8 wherein said window is formed of a ceramic selected from the group consisting of alumina, sapphire and beryllium oxide.

12. The method of claim 8 wherein said stabilized chromium oxide film thickness is between 20 and 150 Angstroms.

13. The method of claim 8 wherein said chromium is applied to said window and sleeve by DC magnetron sputtering.

* * * * *